United States Patent
Goryu et al.

(10) Patent No.: US 11,018,227 B2
(45) Date of Patent: May 25, 2021

(54) SEMICONDUCTOR STORAGE DEVICE, METHOD OF CONTROLLING SEMICONDUCTOR STORAGE DEVICE, COMPUTER PROGRAM PRODUCT, AND METHOD OF FABRICATING SEMICONDUCTOR STORAGE DEVICE

(71) Applicant: Kabushiki Kaisha Toshiba, Tokyo (JP)

(72) Inventors: Akihiro Goryu, Kanagawa (JP); Akira Kano, Kanagawa (JP); Kenji Hirohata, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 84 days.

(21) Appl. No.: 16/117,161

(22) Filed: Aug. 30, 2018

(65) Prior Publication Data
US 2019/0288072 A1    Sep. 19, 2019

(30) Foreign Application Priority Data
Mar. 13, 2018 (JP) ............................. JP2018-045486

(51) Int. Cl.
*G11C 13/04* (2006.01)
*H01L 29/16* (2006.01)
(Continued)

(52) U.S. Cl.
CPC .......... *H01L 29/1608* (2013.01); *G11B 7/126* (2013.01); *G11C 13/048* (2013.01); *H01L 21/02378* (2013.01); *H01L 21/02529* (2013.01)

(58) Field of Classification Search
CPC ........... H01L 29/1608; H01L 21/02529; H01L 21/02378; H01L 27/101; H01L 29/8615;
(Continued)

(56) References Cited

U.S. PATENT DOCUMENTS 7,869,259 B2    1/2011  Asao
8,030,662 B2   10/2011  Suda
(Continued)

FOREIGN PATENT DOCUMENTS

JP    2000-174255 A    6/2000
JP    2005-197634 A    7/2005
(Continued)

OTHER PUBLICATIONS

Okada et al., "Temperature and Current Density Dependence on Expansion/Contraction of Stacking Faults in 4H-SiC PiN diode," (2016), pp. 138-139, and translation, 3 pages.
(Continued)

*Primary Examiner* — Mohammed A Bashar

(74) *Attorney, Agent, or Firm* — Finnegan, Henderson, Farabow, Garrett & Dunner L.L.P

(57) ABSTRACT

A semiconductor storage device comprises a plurality of memory cells arranged in a matrix. Each of the memory cells includes: a semiconductor storage element including a silicon carbide substrate and a silicon carbide film on a first surface of the silicon carbide substrate; a lower electrode on a second surface facing away from the first surface of the silicon carbide substrate; and an upper electrode on at least part of a surface of the silicon carbide film, the surface facing away from another surface of the silicon carbide film in contact with the silicon carbide substrate. Each memory cell includes at least one basal plane dislocation formed at at least part of the semiconductor storage element.

18 Claims, 12 Drawing Sheets

(51) Int. Cl.
 *H01L 21/02* (2006.01)
 *G11B 7/126* (2012.01)
(58) Field of Classification Search
 CPC ..... H01L 29/045; H01L 29/32; G11C 13/048;
 G11C 13/04; G11C 11/56; G11C
 2013/008; G11C 2013/0083; G11C
 13/0097; G11C 2013/0095; G11C
 13/0069; G11C 13/004; G11C 2213/35;
 G11C 13/0002; G11C 13/003
 See application file for complete search history.

(56) References Cited

U.S. PATENT DOCUMENTS

| | | | |
|---|---|---|---|
| 8,890,170 B2 | 11/2014 | Nagasawa et al. | |
| 2005/0226036 A1 | 10/2005 | Aratani et al. | |
| 2009/0195296 A1* | 8/2009 | Miyanagi | H01L 29/861 327/530 |
| 2011/0233562 A1* | 9/2011 | Harada | H01L 29/872 257/77 |
| 2012/0032246 A1* | 2/2012 | Honda | H01L 27/11529 257/316 |
| 2013/0079230 A1 | 3/2013 | Poppe et al. | |
| 2019/0229211 A1* | 7/2019 | Bu | H01L 29/0865 |
| 2019/0244814 A1* | 8/2019 | Saito | C30B 33/02 |

FOREIGN PATENT DOCUMENTS

| | | |
|---|---|---|
| JP | 2009-135291 A | 6/2009 |
| JP | 2009-289822 A | 12/2009 |
| JP | 2013-535805 A | 9/2013 |
| WO | WO 2012/067079 A1 | 5/2012 |

OTHER PUBLICATIONS

Mahadik et al., "Observation of stacking faults from basal plane dislocations in highly doped 4H-SiC epilayers," (Applied Physics Letters 100 (2012), pp. 042102-1-042102-3.

* cited by examiner

FIG.6
(a)
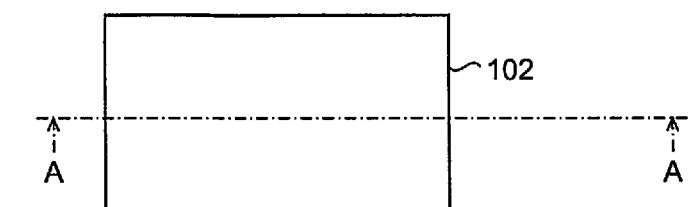
(b)
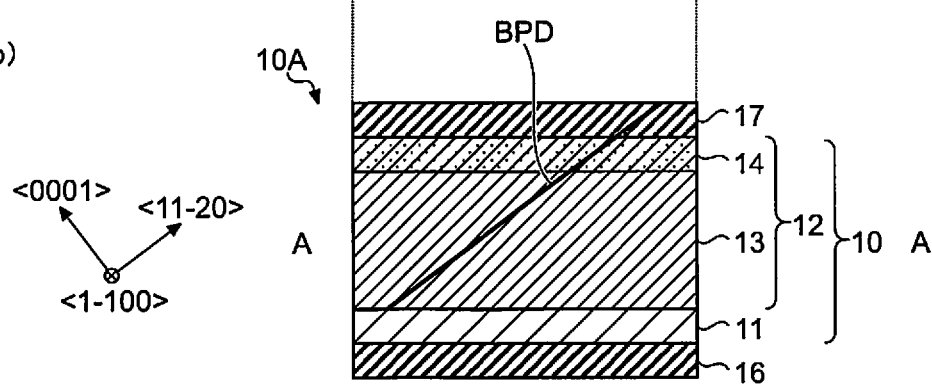

FIG.12
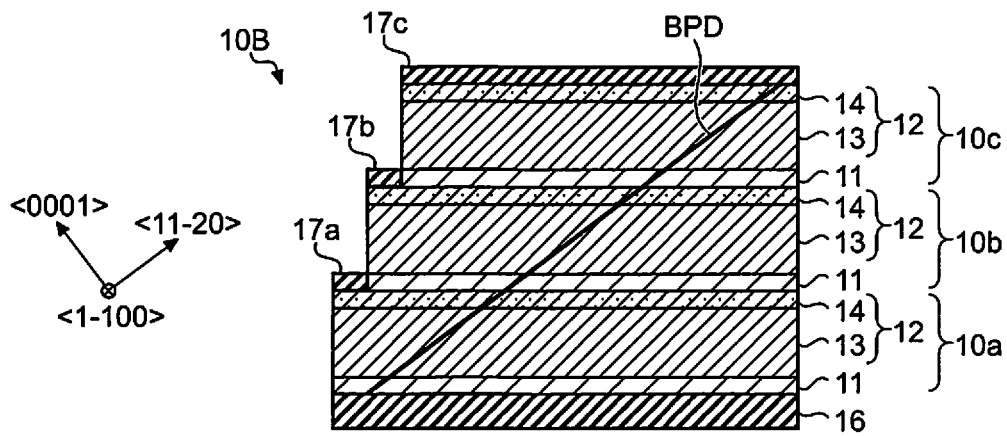
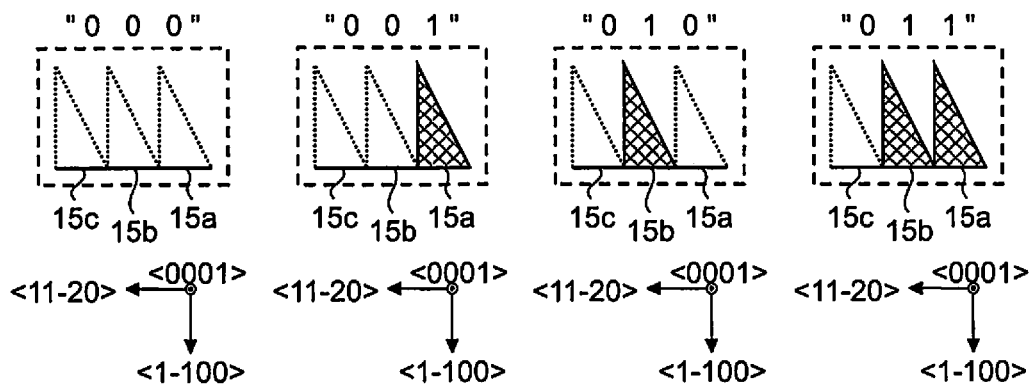
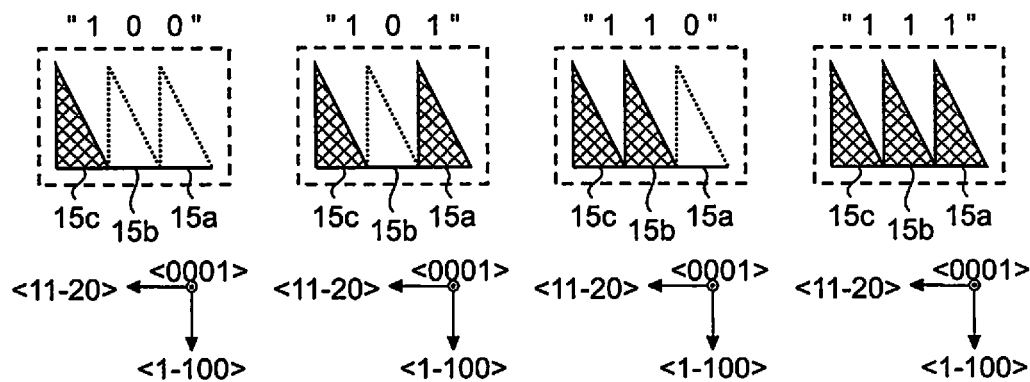

(a)  (b)

SEMICONDUCTOR STORAGE DEVICE, METHOD OF CONTROLLING SEMICONDUCTOR STORAGE DEVICE, COMPUTER PROGRAM PRODUCT, AND METHOD OF FABRICATING SEMICONDUCTOR STORAGE DEVICE

CROSS-REFERENCE TO RELATED APPLICATIONS

This application is based upon and claims the benefit of priority from Japanese Patent Application No. 2018-045486, filed on Mar. 13, 2018; the entire contents of which are incorporated herein by reference.

FIELD

Embodiments described herein relate generally to a semiconductor storage device, a method of controlling the semiconductor storage device, a computer program product, and a method of fabricating the semiconductor storage device.

BACKGROUND

Compound semiconductors having a hexagonal crystal structure have a higher breakdown electric field than silicon (Si). Such compound semiconductors are physically robust, having a high thermal conductivity, high electron mobility, and a wide band gap. In this regard, the hexagonal crystalline compound semiconductors have emerged as an appropriate candidate semiconductor material that can offer a significant increase in device performance compared to the conventional Si semiconductor devices. Conventional technologies are disclosed in Japanese Patent Application Laid-open Nos. 2009-289822, 2013-535805, and 2000-174255, and in OKADA Aoi, et. al., 3rd Meeting on Advanced Power Semiconductors, pp. 138-139, 2016, and N. A. Mahadik, et. al., Applied Physics Letters 100 (4), 042102 (2012).

BRIEF DESCRIPTION OF THE DRAWINGS

FIG. 6 is a diagram illustrating an example memory cell according to the first embodiment;

FIG. 12 is a sectional view schematically illustrating an example configuration of a memory cell according to a third embodiment;

FIGS. 13A to 13H are diagrams illustrating example development states of stacking faults in three semiconductor storage elements and associations between each combination of the development states of the stacking faults and corresponding three-bit information according to the third embodiment;

DETAILED DESCRIPTION

The following describes a semiconductor storage device, a method of controlling the semiconductor storage device, a computer program product, and a method of fabricating the semiconductor storage device according to exemplary embodiments with reference to the accompanying drawings.

As discussed above, semiconductor elements based on a compound semiconductor having a hexagonal crystal structure can achieve a much higher performance than semiconductor elements based on Si semiconductor material. Such a compound semiconductor having a hexagonal crystal structure generates stacking faults in a slip plane (in its close-packed plane in most cases). For example, bipolar elements such as pn diodes made of a 4H silicon carbide (SiC) semiconductor material have an electron-hole recombination region near the interface between an n-type epitaxial layer and a p-type epitaxial layer or between an n-type epitaxial layer and a p-type implantation layer upon application of an electric current. In this recombination region, a stacking fault expands from a basal plane dislocation (BPD) by the electron-hole recombination energy generated upon application of an electric current.

The stacking fault is a planar defect having, for example, a triangular shape. The basal plane dislocation is decomposed into two Shockley partial dislocations in a (0001) plane namely an Si plane that is the basal plane of a single crystal SiC. A planer-stacking fault occurs in a minute region between the two Shockley partial dislocations. This type of stacking fault is referred to as a Shockley stacking fault. It is considered that an area of a stacking fault is increased by a shift of a partial dislocation caused by the electron-hole recombination energy.

This stacking fault region functions as a high resistant region upon application of an electric current. The following describes a semiconductor storage device that can store information therein by using the characteristics of the stacking fault, a method of controlling the semiconductor storage device, and a computer program product for the semiconductor storage device with reference to several examples.

First Embodiment

A first embodiment will be described with reference to the accompanying drawings. In the first embodiment, for example, a semiconductor storage element 10 having a bipolar pn-junction diode structure made of a SiC semiconductor material having a hexagonal crystal structure is described.

In the crystal orientations of a SiC crystal, a plane perpendicular to the <0001> direction is hereinafter referred to as a (0001) plane, a plane perpendicular to the <11-20> direction as a (11-20) plane, and a plane perpendicular to the <1-100> direction as a (1-100) plane. The (0001) plane is also referred to as the Si plane or the basal plane, and the (000-1) plane is referred to as the C-plane.

Figure 1:
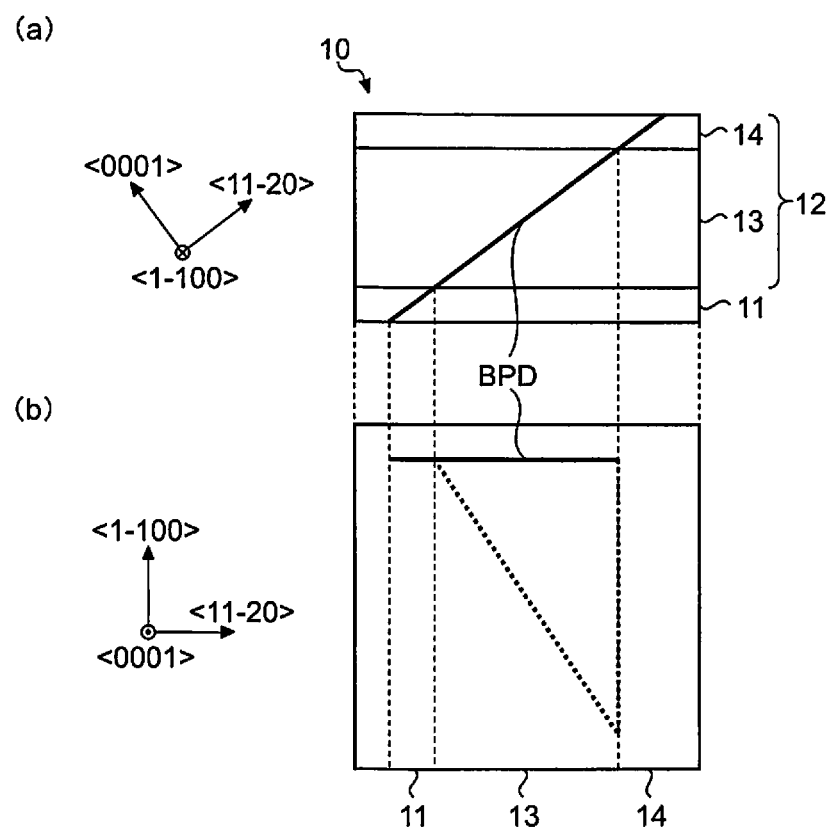
FIG. 1 is a diagram illustrating an example semiconductor storage element according to a first embodiment.

FIG. 1 is a diagram illustrating an example semiconductor storage element according to the first embodiment. FIG. 1(a) is a sectional view of the semiconductor storage element 10 cut along a plane parallel to the (1-100) plane of a SiC crystal having a hexagonal shape, and FIG. 1(b) is a sectional view of the semiconductor storage element 10 cut along a slip plane (corresponding to the (0001) plane) including a basal plane dislocation.

As illustrated in FIG. 1, the semiconductor storage element 10 includes a SiC substrate 11 and an epitaxially grown film 12 fabricated on the SiC substrate 11. The SiC substrate 11 may be an $N^+$-type substrate to which a donor such as phosphorus (P) or arsenic (As) is added, for example. The epitaxially grown film 12 includes an N-type well layer 13 and a $P^+$-type ion implanted layer 14 to which an acceptor such as boron (B) or aluminum (Al) is implanted. The $P^+$-type ion implanted layer 14 may be a contact layer in contact with, for example, an upper electrode 17 to be described later.

The semiconductor storage element 10 having the configuration above includes one or more basal plane dislocations. The basal plane dislocation, from which a stacking fault grows, may be a dislocation originally included in the SiC substrate 11, a dislocation specifically generated at the interface between the epitaxially grown film 12 and the SiC substrate 11, or a dislocation intentionally generated by, for example, scratching on the element surface.

Figure 2:
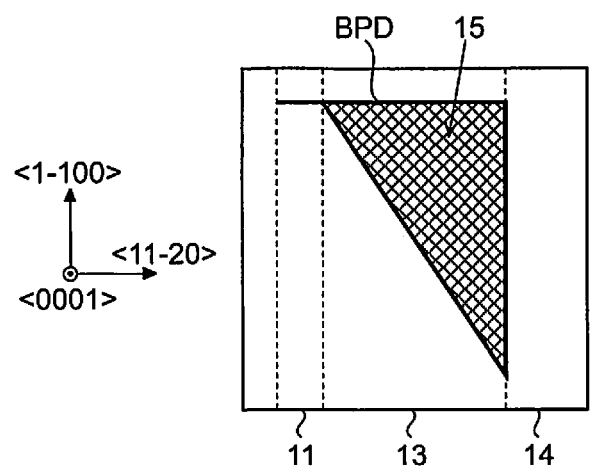
FIG. 2 is a sectional view illustrating a slip plane (a (0001) plane) corresponding to FIG. 1(b)

Application of a stress to the semiconductor storage element 10 having such an element structure expands a stacking fault from a basal plane dislocation. For example, application of an electric current (hereinafter referred to as a first current) equal to or greater than a certain threshold current to the semiconductor storage element 10 in a certain temperature condition (first temperature) expands the stacking fault 15 from the basal plane dislocation along the (0001) plane as illustrated in FIG. 2. FIG. 2 is a sectional view illustrating a slip plane (a (0001) plane) corresponding to FIG. 1(b).

As the stacking fault 15 expands as illustrated in FIG. 2, a resistance value of the semiconductor storage element 10 increases. In the first embodiment, for example, the semiconductor storage element 10 having an increased resistance value due to the expansion of the stacking fault 15 as illustrated in FIG. 2 is defined as a semiconductor storage element 10 having a bit value of '1'. The semiconductor storage element 10 having no expansion of the stacking fault 15 as illustrated in FIG. 1(b) is defined as a semiconductor storage element 10 having a bit value of '0'. Associating a bit value with the resistance value that varies in accordance with the state of the stacking fault 15 can implement a nonvolatile semiconductor storage device 100 that can store therein information using the characteristics of the stacking fault 15.

Application of a different stress to the semiconductor storage element 10 reduces the stacking fault 15 that has expanded along the slip plane ((0001) plane). For example, application of an electric current (hereinafter referred to as a second current) equal to or smaller than a certain threshold current to the semiconductor storage element 10 in a certain temperature condition (second temperature) causes the stacking fault 15 to start shrinking and ultimately vanish. Using the characteristics of the expanding and contracting stacking fault 15 for storing information can implement a rewritable, variable resistance semiconductor storage device 100.

In reading data from the semiconductor storage element 10, the resistance value of the semiconductor storage element 10 is measured in a condition in which no expansion or contraction of the stacking fault 15 occurs. The resistance value is measured while, for example, an electric current (hereinafter referred to as third current) having a certain current value is applied to the semiconductor storage element 10 in a temperature condition (third temperature) in which no expansion or contraction of the stacking fault 15 occurs. The measured resistance value is compared with a threshold set in advance, and the data (e.g., bit value) stored in the semiconductor storage element 10 is determined.

Details of the stresses applied to the stacking fault 15 for its expansion or contraction, and conditions in which no expansion or contraction of the stacking fault 15 occurs, namely, details of the first to third temperatures and the first to third currents are disclosed in, for example, OKADA et., al. The disclosed details can be used in the first embodiment and thus explanations thereof are omitted herein.

Figure 3:
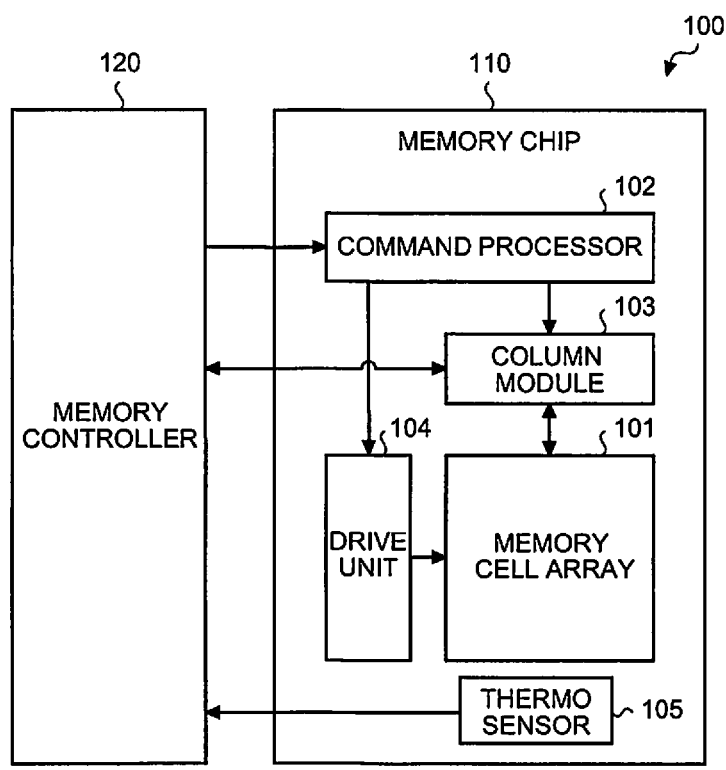
FIG. 3 is a block diagram schematically illustrating an example configuration of a semiconductor storage device according to the first embodiment.

FIG. 3 is a block diagram schematically illustrating an example configuration of the semiconductor storage device according to the first embodiment. As illustrated in FIG. 3, the semiconductor storage device 100 includes a memory chip 110 and a memory controller 120. The memory controller 120 is connected to external devices such as personal computers and mobile phones via a certain interface and controls access from the external devices to the memory chip 110.

The memory chip 110 includes a command processor 102, a drive unit 104, a memory cell array 101, a column module 103, and a thermo sensor 105. The command processor 102 includes, for example, a sequencer, a command register, and an address register, and executes operations in accordance with a read command, a write command, and an erase command input from the memory controller 120. The drive unit 104 includes, for example, a driver circuit and a row decoder (R/D), and supplies read voltage to blocks selected by the row decoder.

The column module 103 includes, for example, a sense amplifier and a data latch including a plurality of latch circuits. In a write operation, the column module 103 transfers write data received from the memory controller 120 to the memory cell array 101. In a read operation, the column module 103 senses data read from the memory cell array 101 and performs necessary calculations. The column module 103 outputs the obtained read data to the memory controller 120.

The thermo sensor 105 detects a temperature around the memory cell array 101 on a constant, regular, or an appropriate basis, and outputs a signal indicating the detected temperature to the memory controller 120.

Figure 4:
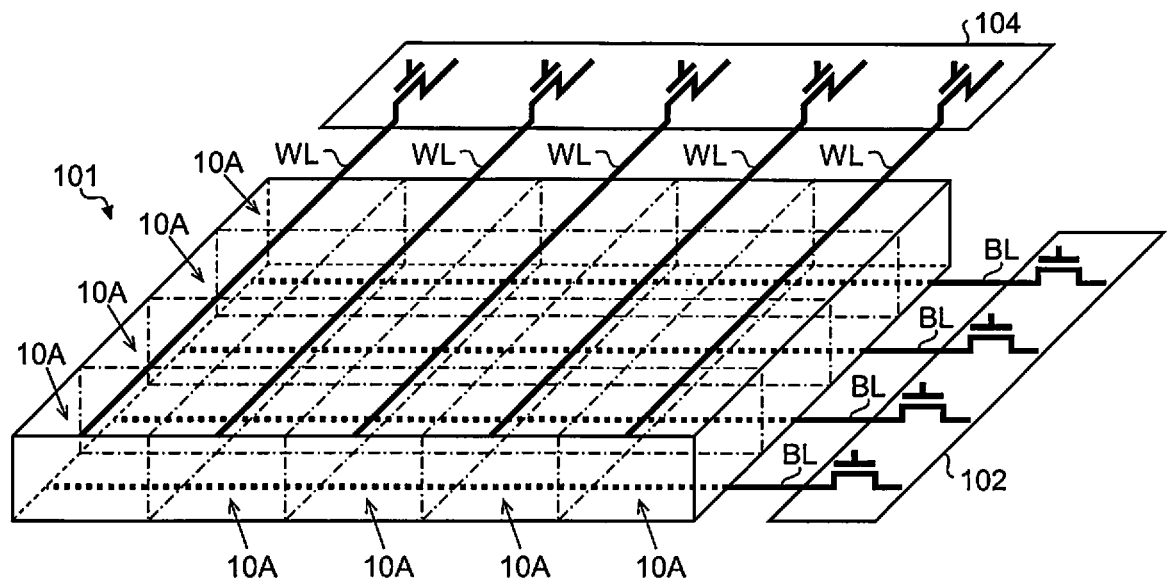
FIG. 4 is a diagram illustrating an example memory cell array according to the first embodiment.
Figure 5:
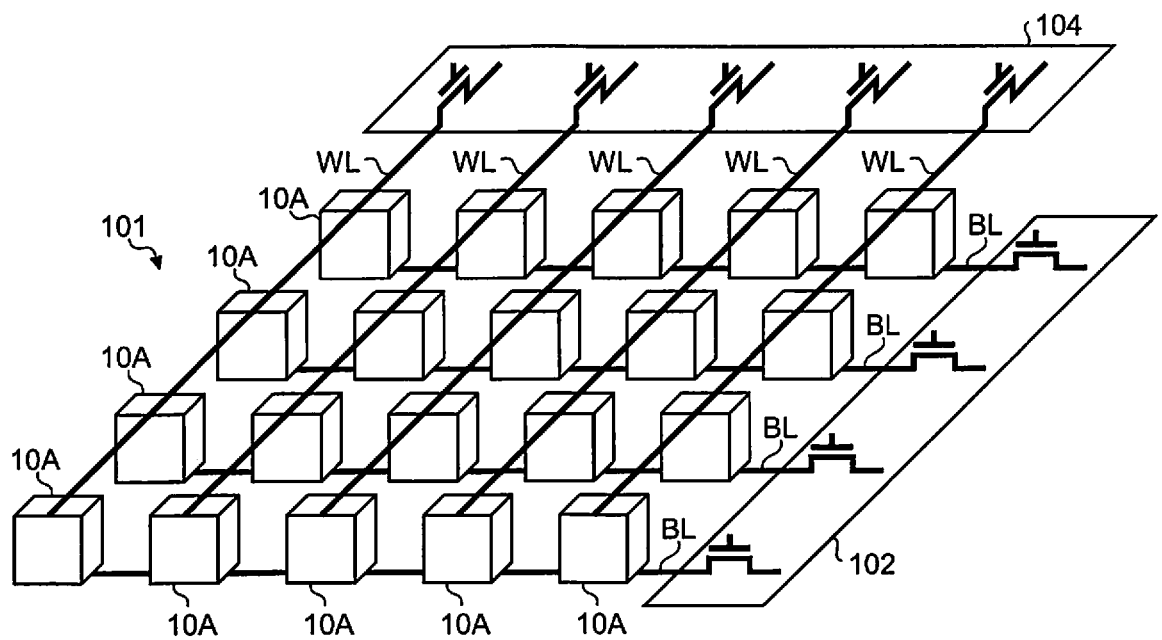
FIG. 5 is a diagram illustrating another example memory cell array according to the first embodiment.

FIG. 4 is a diagram illustrating an example memory cell array according to the first embodiment. As illustrated in FIG. 4, the memory cell array 101 includes a plurality of memory cells 10A arranged two-dimensionally. Adjacent memory cells 10A are electrically separated by, for example, an insulation film and trenches. The architecture of the memory cells 10A is not limited to this. As illustrated in FIG. 5, for example, each memory cell 10A may have a mesa structure to electrically separate from the adjacent memory cells 10A.

As illustrated in FIGS. 4 and 5, the memory cells 10A are each connected to any one of a plurality of word lines WL and to any one of a plurality of bit lines BL. In this regard, each memory cell 10A can be determined by an address specifying the word line WL and an address specifying the bit line BL.

As illustrated in FIG. 6, each memory cell 10A can include the semiconductor storage element 10 above. In other words, the memory cell 10A according to the first embodiment is configured by, for example, a lower electrode 16 electrically connected to a bit line BL, the upper electrode 17 electrically connected to a word line WL, and the semiconductor storage element 10 interposed therebetween. The lower electrode 16 and the upper electrode 17 may be, for example, metal electrodes. As illustrated in FIG. 6(a), for example, the upper electrode 17 covers the upper surface of the $p^+$-type ion implanted layer 14 of the epitaxially grown film 12. FIG. 6(a) is a top view of a memory cell 10A and FIG. 6(b) is a sectional view of the memory cell 10A cut along a plane parallel to the (1-100) plane of an SiC crystal.

The memory chip 110 discussed above writes and reads data on what is called a page basis and erases data on what is called a block basis. In the first embodiment, a plurality of memory cells connected to a single identical word line are collectively called a memory cell group. If each memory cell is configured as a single level cell (SLC) that stores therein one bit of data, a single memory cell group corresponds to one page. If each memory cell is configured as a multiple level cell (MLC), a triple level cell (TLC), or a quad level cell (QLC) that stores therein a plurality of bits, a single memory cell group corresponds to a plurality of pages. The operation of the memory chip 110 is not limited to such a page-based or block-based operation. Individual memory cell 10A may function as a unit of operation on which write, read, and erase operations are performed. Various other modifications may be made.

Described next are a write operation, an erase operation, and a read operation of the semiconductor storage device 100 with reference to the accompanying drawings. The following describes example page-based write/read operations and an example block-based erase operation.

Figure 7:
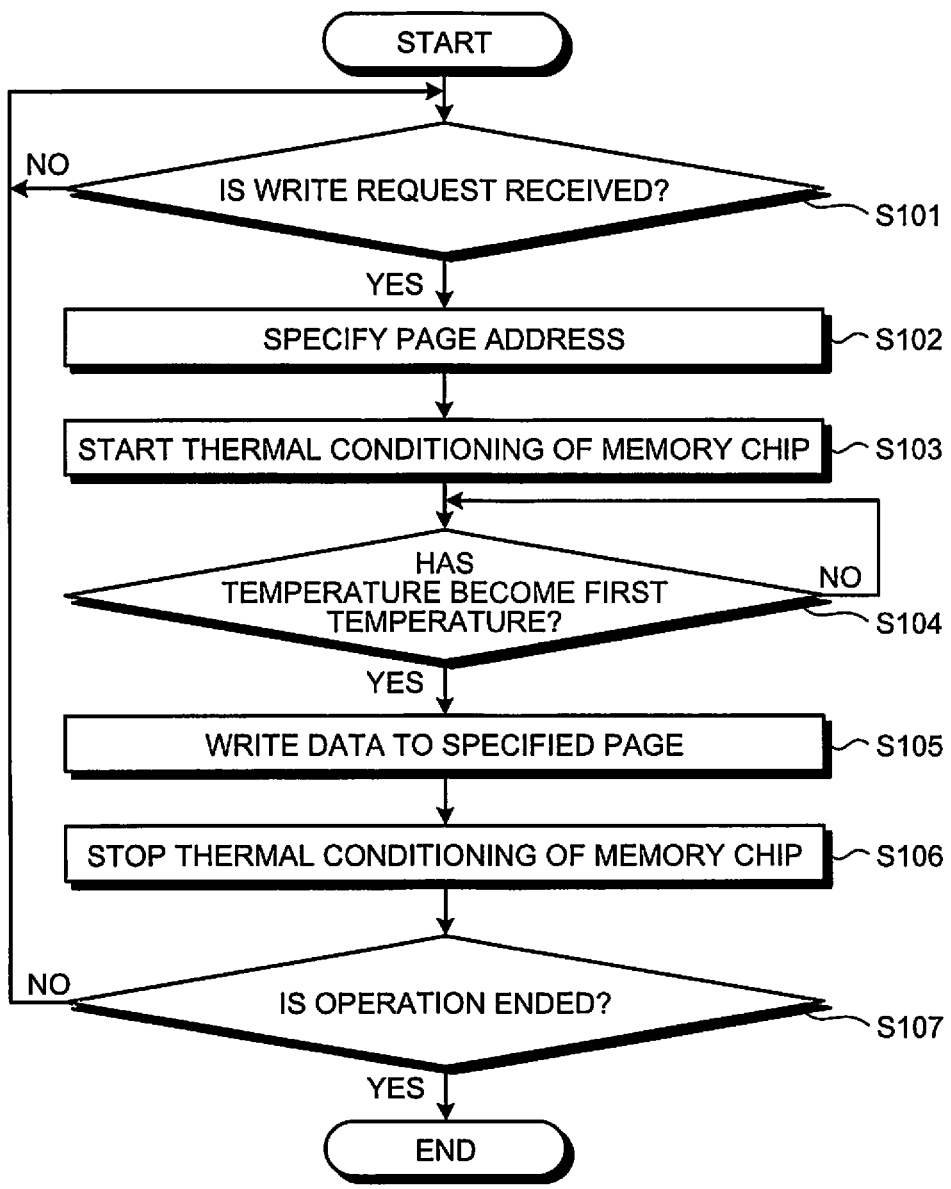
FIG. 7 is a flowchart illustrating an example write operation according to the first embodiment.

FIG. 7 is a flowchart illustrating an example write operation according to the first embodiment. In the write operation illustrated in FIG. 7, the memory controller 120 waits for a write request from an external device (No at Step S101). Upon reception of a write request (Yes at Step S101), the memory controller 120 translates a logical address received from the external device together with the write request into a physical address by using, for example, an address translation table (not illustrated), and specifies a page address to which data is written (Step S102). The specified page address is input to the command processor 102 in the memory chip 110 together with a write command.

Upon reception of the write command, for example, the command processor 102 controls a thermal conditioning unit such as a heater or a Peltier element (not illustrated) in the memory chip 110 for thermal conditioning of the memory chip 110 (Step S103). The command processor 102 may control the drive unit 104 to apply current to the word lines WL for thermal conditioning of the memory chip 110 instead of controlling the thermal conditioning unit such as the heater or the Peltier element (not illustrated). The command processor 102 waits until the temperature of the memory chip 110 becomes the first temperature (No at Step S104). If the temperature of the memory chip 110 becomes the first temperature (Yes at Step S104), the command processor 102 writes data to the page address specified at Step S102 (Step S105). Before writing, for example, all the memory cells 10A in the page have a bit value of '0'. The command processor 102 controls the write operation such that it applies the first current for expanding the stacking fault 15 to memory cells 10A to which a bit value of '1' is written, and does not apply the first current to memory cells 10A to which a bit value of '0' is written.

The command processor 102 then, for example, stops the thermal conditioning of the memory chip 110 (Step S106). Subsequently, for example, the memory controller 120 determines whether to end the write operation (Step S107), and if it determines to end the operation (Yes at Step S107), the write operation is ended. If not (No at Step S107), the process returns to Step S101 and the memory controller 120 waits for the next write request.

Figure 8:
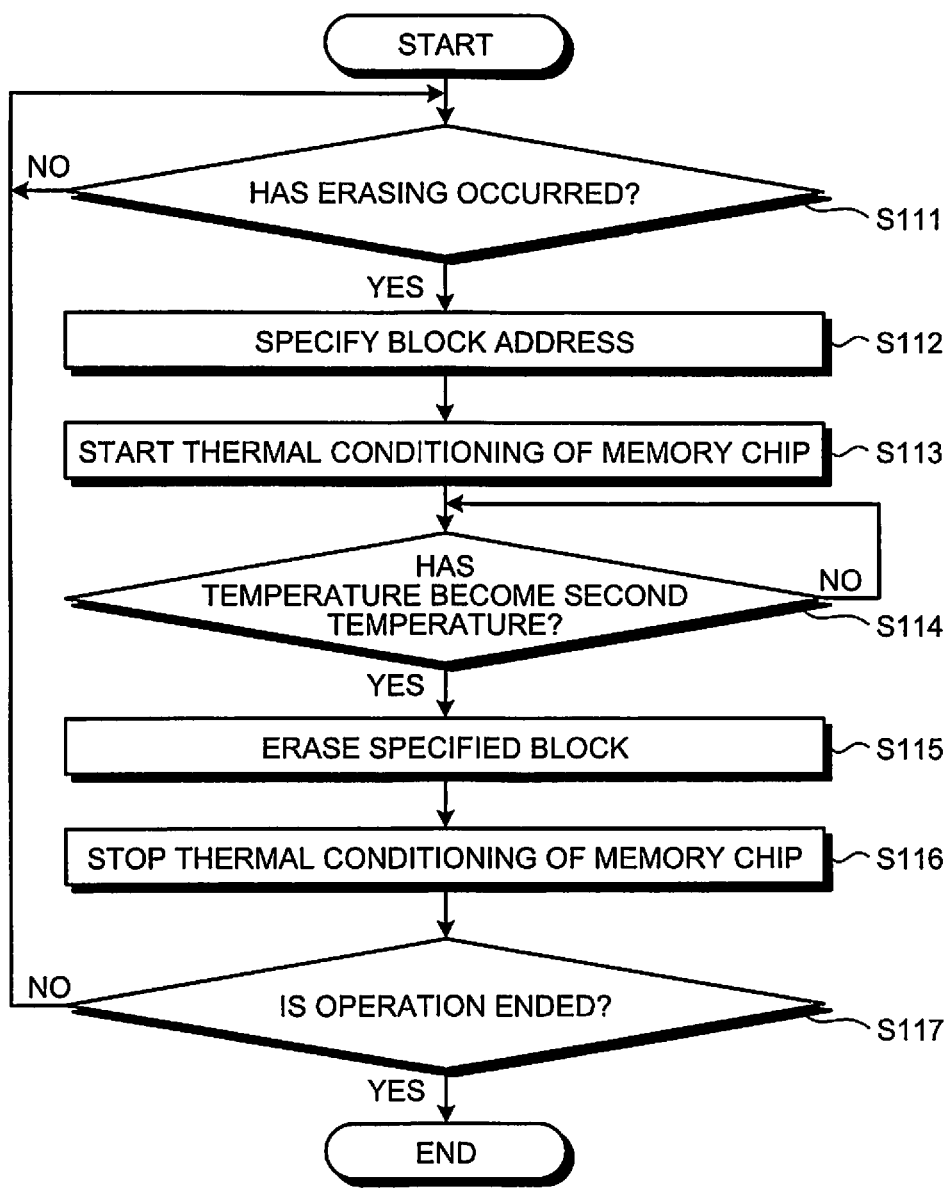
FIG. 8 is a flowchart illustrating an example erase operation according to the first embodiment.

FIG. 8 is a flowchart illustrating an example erase operation according to the first embodiment. In the erase operation illustrated in FIG. 8, the memory controller 120 determines whether block erasing occurs as part of, for example, garbage collection (Step S111). If block erasing occurs (Yes at Step S111), the memory controller 120 specifies an address of the block to be erased (Step S112).

In the same manner as in Step S103 in FIG. 7, for example, the command processor 102 controls the thermal conditioning unit such as a heater or a Peltier element (not illustrated) in the memory chip 110 for thermal conditioning of the memory chip 110 (Step S113). The command processor 102 waits until the temperature of the memory chip 110 becomes the second temperature (No at Step S114). If the temperature of the memory chip 110 becomes the second temperature (Yes at Step S114), the command processor 102 erases data from the block specified at Step S112 (Step S115). In this erase operation, for example, the second current for reducing the stacking fault 15 is applied to all the memory cells 10A in the block. The second current may have, for example, a lower current value than the first current.

The command processor 102 then, for example, stops the thermal conditioning of the memory chip 110 (Step S116). Subsequently, for example, the memory controller 120 determines whether to end the erase operation (Step S117), and if it determines to end the operation (Yes at Step S117), the erase operation is ended. If not (No at Step S117), the process returns to Step S111 and the memory controller 120 waits for the next erase operation.

Figure 9:
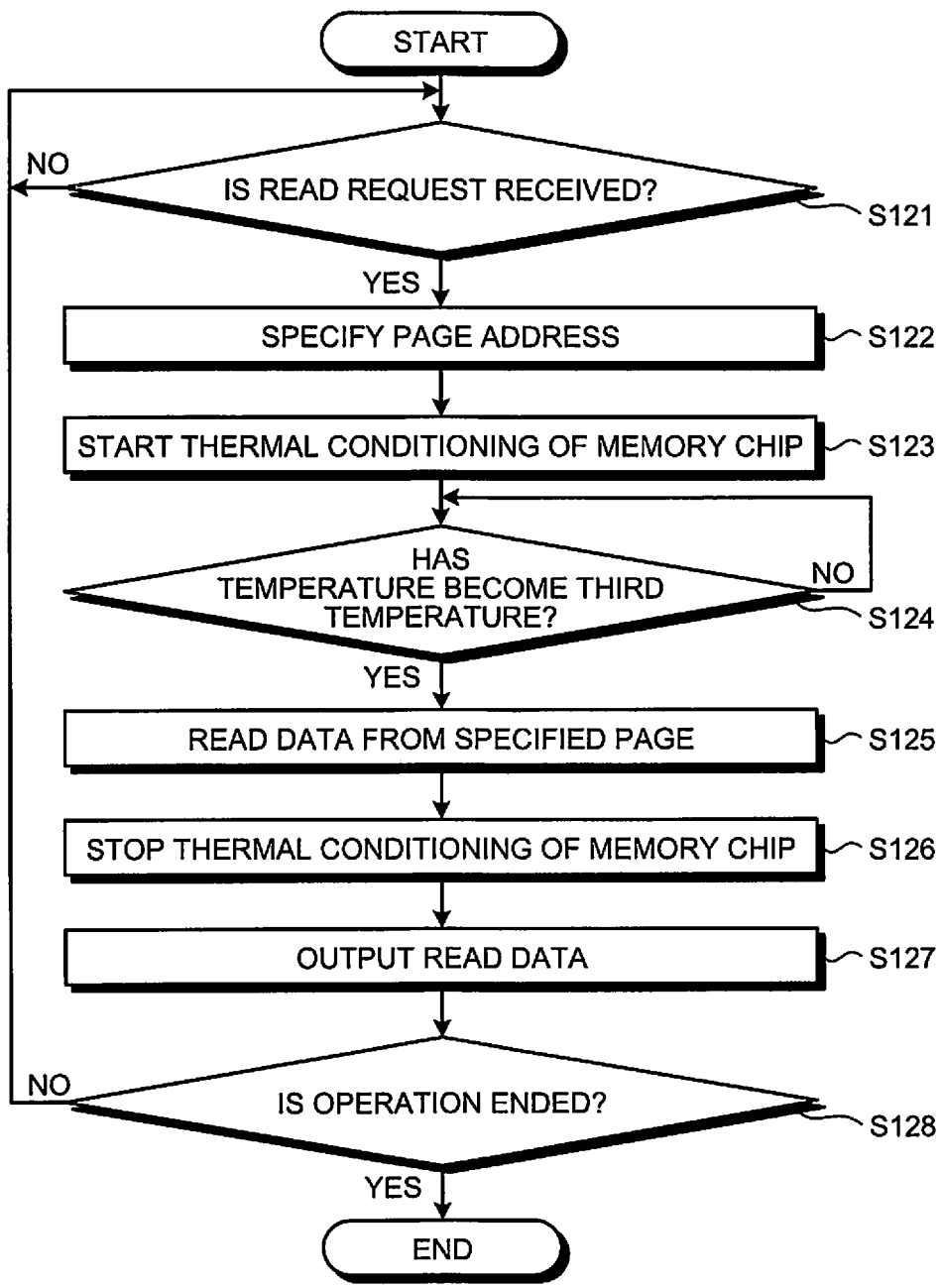
FIG. 9 is a flowchart illustrating an example read operation according to the first embodiment.

FIG. 9 is a flowchart illustrating an example read operation according to the first embodiment. In the read operation illustrated in FIG. 9, the memory controller 120 waits for a read request from an external device (No at Step S121). Upon reception of a read request (Yes at Step S121), the memory controller 120 translates a logical address received from the external device together with the read request into a physical address by using, for example, an address translation table (not illustrated) and specifies a page address from which data is read (Step S122). The specified page address is input to the command processor 102 in the memory chip 110 together with a read command.

In the same manner as in Step S103 in FIG. 7, for example, the command processor 102 controls the thermal conditioning unit such as a heater or a Peltier element (not illustrated) in the memory chip 110 for thermal conditioning of the memory chip 110 (Step S123). The command processor 102 waits until the temperature of the memory chip 110 becomes the third temperature (No at Step S124). At the third temperature (Yes at Step S124), the command processor 102 reads data from the page address specified at Step S122 (Step S125). The third temperature and the third current may be a temperature and a current at which no expansion or contraction of the stacking fault 15 occurs. The third temperature may be, for example, between the first and the second temperatures. The third current may be greater than the second current and lower than the first current. Which is higher among the first to third temperatures and which is greater among the first to third currents are not limited to those described above. Various modifications can be made on the temperatures and currents if the intended write, erase, and read operations can be implemented with the temperatures and currents.

The command processor 102 stops the thermal conditioning of the memory chip 110 (Step S126). The memory controller 120 then, for example, outputs read data read at Step S125 to the transmission source of the read request (Step S127). The memory controller 120 then determines whether to end the read operation (Step S128), and if it determines to end the operation (Yes at Step S128), the read operation is ended. If not (No at Step S128), the process returns to Step S121 and the memory controller 120 waits for the next read request.

Figure 10:
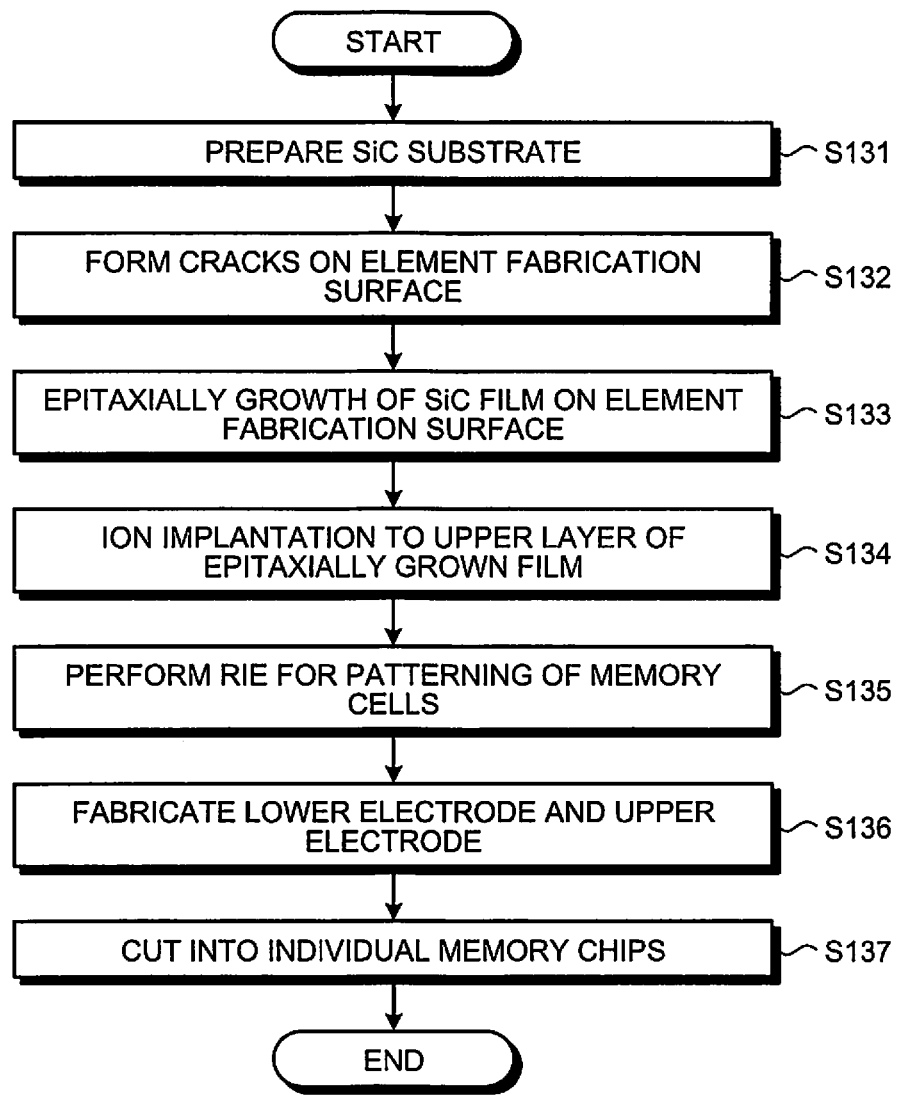
FIG. 10 is a flowchart illustrating a method of fabricating a memory chip according to the first embodiment.

Described next is a method of fabricating the memory chip 110 according to the first embodiment. FIG. 10 is a flowchart illustrating the method of fabricating the memory chip according to the first embodiment. As illustrated in FIG. 10, the fabrication method starts from, for example, preparation of a wafer SiC substrate 11 (Step S131). The wafer SiC substrate 11 can be made by, for example, slicing an SiC ingot into wafers with a certain thickness and polishing the surface thereof. The wafer SiC substrate 11 includes a donor, such as phosphorus (P) or arsenic (As).

An element fabrication surface of the SiC substrate 11 is scratched with a needle-point like tool to form cracks thereon from which basal plane dislocations grow (Step S132). The cracks can be formed not only by scratching but by sandblast or various other methods. At Step S132, for example, the element fabrication surface of the SiC substrate 11 is scratched such that each memory cell 10A has at least one crack.

Subsequently, for example, epitaxial growth is performed to fabricate an SiC film (epitaxially grown film 12) on the element fabrication surface of the SiC substrate 11 (Step S133). Ion implantation is performed on an upper layer of the epitaxially grown film 12 fabricated in Step S133 and an acceptor such as boron (B) or aluminum (Al) is added to the upper layer to form a P$^+$-type ion implanted layer 14 (Step S134). A region not including the acceptor in the epitaxially grown film 12 functions as an N-type well layer 13.

Subsequently, for example, reactive ion etching (RIE) is performed on the epitaxially grown film 12 (and on the SiC substrate 11) for patterning to electrically separate the adjacent memory cells 10A (Step S135). Trenches formed by, for example, RIE may be filled with an insulation film such as a silicon oxide film.

The lower electrode 16 and the upper electrode 17 are formed on each memory cell 10A (Step S136), and then the wafer is cut into individual memory chips 110 by, for example, dicing (Step S137). With these processes, a memory chip 110 including memory cells 10A each including at least one crack from which a basal plane dislocation grows is fabricated.

In the fabrication method described above, cracks from which basal plane dislocations grow are formed on the wafer SiC substrate 11, but locations of the cracks are not limited to this. For example, such cracks from which basal plane dislocations grow may be formed on the epitaxially grown film 12, and various other modifications can be made.

According to the first embodiment above, application of electrical stress and/or the thermal stress to the memory cell array 101 including the semiconductor storage elements 10 made of a compound semiconductor including stacking faults 15 arranged in a matrix develops or reduces the stacking faults 15. The resistance value that varies in accordance with the state of the stacking fault 15 is associated with a bit value. With this configuration, an involatile semiconductor storage device 100 that can store information using the characteristics of the stacking fault 15 can be achieved. Using the characteristics of the expanding and contracting stacking fault 15 for storing information can implement a rewritable, variable resistance semiconductor storage device 100.

When there is no data to be written or erased in the first embodiment, constant stress may be applied to the memory chip 110 in a certain direction. The stacking fault 15 allows a certain amount of current before the current reaches the threshold current above which the stacking fault 15 develops. Therefore, application of a current not exceeding the threshold current develops no stacking fault. However, for example, application of compressive stress or tensile stress to the SiC substrate 11 in the <11-20> direction of the SiC crystal orientations helps the threshold current increase or decrease. In this regard, when there is no data to be written to the memory chip 110, compressive stress is applied to the memory chip 110 in a direction that increases the threshold current above which the stacking fault 15 develops, namely in the <11-20> direction. This configuration can protect the semiconductor storage device 100 from, for example, unintentional data alteration.

Second Embodiment

A second embodiment will be described with reference to the accompanying drawings. In the first embodiment above, for example, a single bit of information is stored in each memory cell 10A, that is, each memory cell 10A is configured as an SLC. However, each memory cell 10A can be configured as a memory cell that stores multiple bits of information such as an MLC or a TLC. In the second embodiment, each memory cell 10A is configured as an MLC that can store therein two bits of information. A preferred example will be described below. It is also possible that each memory cell 10A stores therein three or more bits of information by using a concept similar to the concept described below.

The semiconductor storage elements and the semiconductor storage device using the semiconductor storage elements as memory cells according to the second embodiment may be identical to the semiconductor storage elements 10 and the semiconductor storage device 100 described in the first embodiment. The second embodiment differs from the first embodiment in that expansion states of the stacking fault 15 in each semiconductor storage element 10 are controlled to be in, for example, any one of four states corresponding to two bits of information. The second embodiment is described with reference to FIG. 11.

Figure 11:
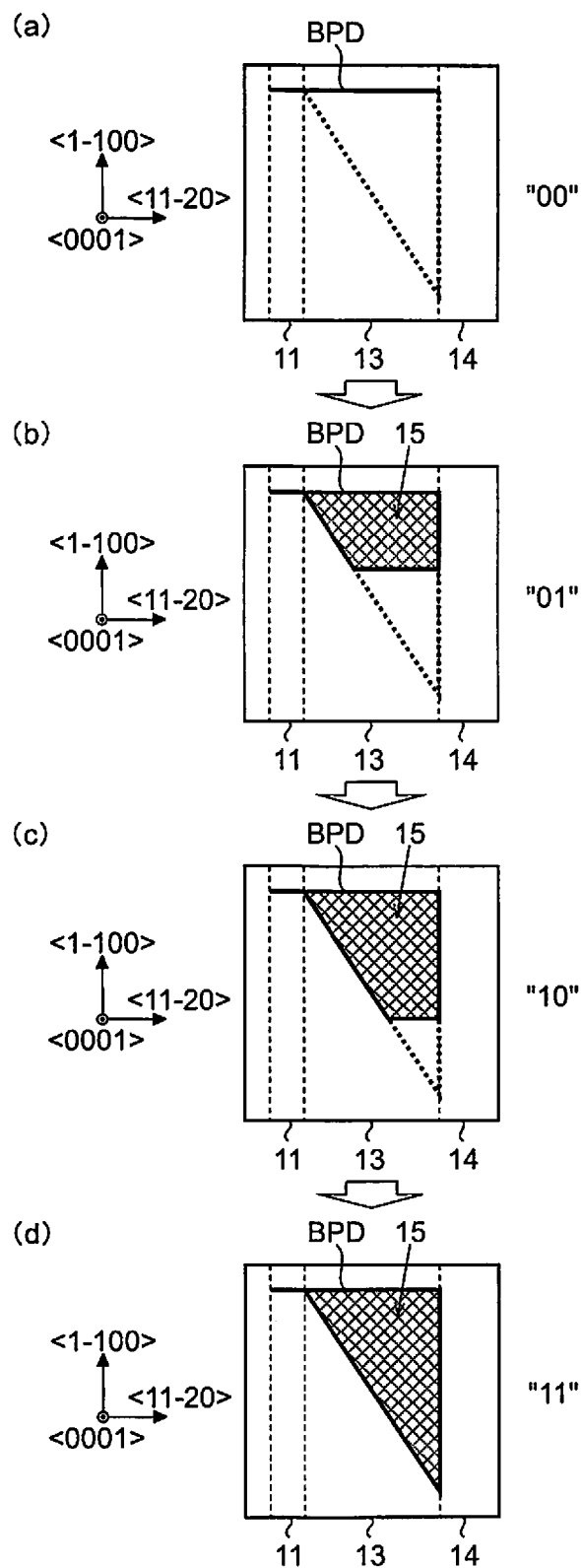
FIG. 11 is a diagram illustrating development states of a stacking fault in a memory cell configured as a multiple level cell (MLC) according to a second embodiment.

FIG. 11 is a diagram illustrating development states of a stacking fault of a memory cell configured as an MLC according to the second embodiment. FIG. 11(a) illustrates substantially no development of the stacking fault 15, FIG. 11(b) illustrates an about one-third development of the stacking fault 15, FIG. 11(c) illustrates about two-thirds development of the stacking fault 15, and FIG. 11(d) illustrates a substantially fully developed stacking fault 15.

As illustrated in FIGS. 11(a) to 11(d), the stacking fault 15 originates from a basal plane dislocation and develops from the Si-core when the semiconductor storage element 10 is subjected to conditions (temperature and first current) with which the stacking fault 15 develops. With this configuration, for example, controlling how much time the first current is applied to the semiconductor storage element 10 can create intermediate states between a state in which no stacking fault 15 is developed (see FIG. 11(a)) and a state in which the stacking fault 15 is substantially fully developed (see FIG. 11(d)).

In order for the memory cell 10A to function as an MLC in the second embodiment, the memory cell 10A has two more states (see FIGS. 11(b) and 11(c)) between the state in which no stacking fault 15 is developed (see FIG. 11(a)) and the state in which the stacking fault 15 is substantially fully developed (see FIG. 11(d)). Consequently, the memory cell 10A has four states in total and each state is associated with any one piece of two-bit information. In the examples illustrated in FIG. 11, a state illustrated in FIG. 11(a) is associated with information having a bit value of "00", a state illustrated in FIG. 11(b) is associated with information having a bit value of "01", a state illustrated in FIG. 11(c) is associated with information having a bit value of "10", and a state illustrated in FIG. 11(d) is associated with information having a bit value of "11".

In data writing according to the second embodiment, a plurality of development states can be created in the stacking fault 15 by controlling the conditions to which the memory cells 10A are subjected. This configuration allows each memory cell 10A to store therein two or more bits of information.

The other configurations, operations, and effects of the second embodiment are the same as those of the first embodiment above, and details thereof are not described herein.

Third Embodiment

A third embodiment will be described with reference to the accompanying drawings. The second embodiment above describes a memory cell 10A in which the stacking fault 15 is developed to intermediate developing states so that the memory cell 10A can function as a memory cell storing therein two or more bits of information. In the third embodiment, a single memory cell is configured by a plurality of semiconductor storage elements, and each semiconductor storage element stores therein one bit or multiple bits of information. The memory cell, therefore, stores therein two or more bits of information. For ease of discussion, the following describes an example memory cell configured by three semiconductor storage elements each storing one bit of information, that is, describes a memory cell configured as a TLC.

The semiconductor storage elements and the semiconductor storage device according to the third embodiment may be identical to the semiconductor storage elements 10 and the semiconductor storage device 100 according to the first and second embodiments above. In the third embodiment, the memory cells 10A included in the memory cell array 101 of the semiconductor storage device 100 are replaced with memory cells 10B illustrated in FIG. 12.

FIG. 12 is a sectional view schematically illustrating an example configuration of a memory cell according to the third embodiment. FIG. 12 is a sectional view of a memory cell 10B cut along a plane parallel to the (1-100) plane of an SiC crystal.

As illustrated in FIG. 12, the memory cell 10B includes semiconductor storage elements 10a to 10c that are stacked in three stages, each semiconductor storage element having the same configuration as the semiconductor storage element 10 described with reference to FIG. 1 in the first embodiment. The lower electrode 16 is provided on a lower surface of the lowermost semiconductor storage element 10a. Upper electrodes 17a to 17c for writing, reading, and erasing data to and from the semiconductor storage elements 10a to 10c, respectively, are provided on the $P^+$-type ion implanted layer 14 that is the uppermost layer of each stage.

FIGS. 13A to 13H are diagrams illustrating example development states of stacking faults 15a to 15c in the three semiconductor storage devices 10a to 10c and associations between each combination of the development states of the stacking faults 15a to 15c and corresponding three-bit information. As illustrated in FIGS. 13A to 13H, a stacking fault 15 with substantially no development is associated with a bit value of '0' and a stacking fault 15 that has substantially been fully developed is associated with a bit value of '1'. This configuration allows each memory cell 10B to store therein eight patterns of information, namely "000" to "111" corresponding to three bits of information, in the present example.

As described above, the semiconductor storage elements 10a to 10c are each associated with a single bit of information, and the memory cell can store multiple bits of information. Moreover, combining the third embodiment with the second embodiment above, that is, including a plurality of semiconductor storage elements each storing multiple bits of information according to the second embodiment in a single memory cell enables the memory cell to store more bits of information. This configuration can further increase the capacity of the semiconductor storage device.

The other configurations, operations, and effects of the third embodiment are the same as those of the first and second embodiments above, and details thereof are not described herein.

Fourth Embodiment

A fourth embodiment will be described with reference to the accompanying drawings. Stacking faults formed in a compound semiconductor having a hexagonal crystal structure such as 4H SiC can be detected by application of optical stress, and the development or reduction of the stacking faults can be controlled by application of optical stress. This means that data can be optically written, read, and erased to and from semiconductor storage elements made of a compound semiconductor having a hexagonal crystal structure. In the fourth embodiment, the semiconductor storage element 10 according to the first to third embodiments above is configured as an optical storage medium. A preferred example will be described below.

The semiconductor storage elements and the semiconductor storage device according to the fourth embodiment may be identical to the semiconductor storage elements 10 and the semiconductor storage device 100 according to the first to third embodiments above. In the fourth embodiment, the memory cells 10A or 10B included in the memory cell array 101 of the semiconductor storage device 100 are replaced with memory cells 10C illustrated in FIG. 14.

Figure 14:
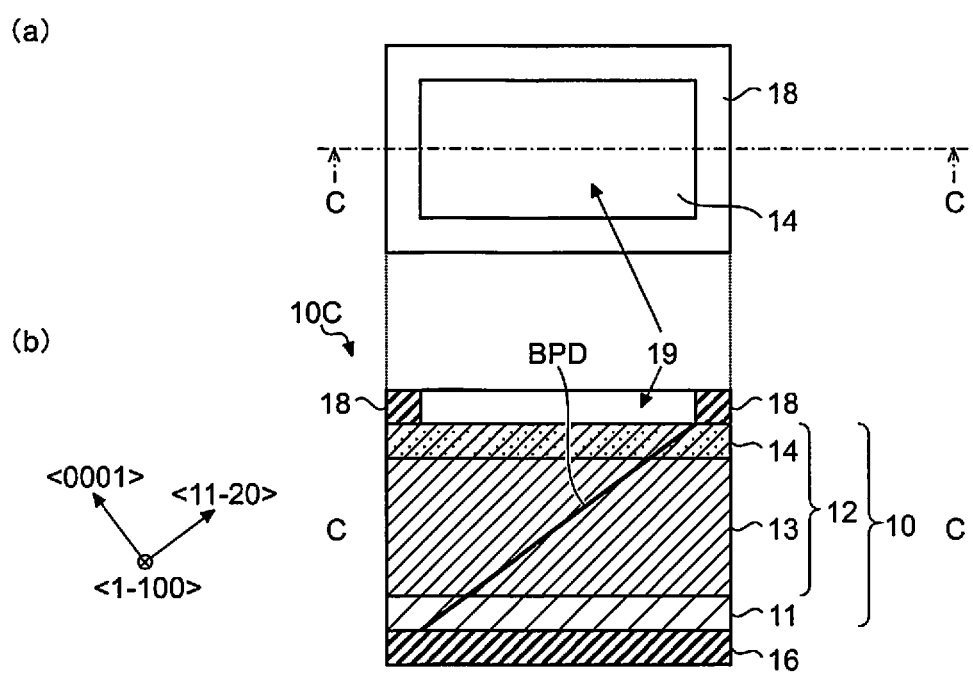
FIG. 14 is a diagram schematically illustrating an example configuration of a memory cell according to a fourth embodiment.

FIG. 14 is a diagram schematically illustrating an example configuration of a memory cell according to the fourth embodiment. FIG. 14(a) is a top view of a memory cell 10C and FIG. 14(b) is a sectional view of the memory cell 10C cut along a plane parallel to the (1-100) plane of an SiC crystal. As illustrated in FIG. 14, the memory cell 10C according to the fourth embodiment has the same configuration as the memory cell 10A illustrated in FIG. 6 and includes, for example, an open upper electrode 18 instead of the upper electrode 17. The open upper electrode 18 has an aperture 19 through which the $P^+$-type ion implanted layer 14 is optically exposed. If the semiconductor storage element 10 is irradiated with light having a first wavelength through the aperture 19, the stacking fault 15 is expanded and information can be written in the semiconductor storage element 10. In the same manner, if the semiconductor storage element 10 is irradiated with light having a second wavelength different from the first wavelength through the aperture 19, the stacking fault 15 is reduced and information can be erased from the semiconductor storage element 10. With regard to the optical stress (e.g., first wavelength and second wavelength) to be applied to the semiconductor storage element 10 in writing/erasing information, conditions disclosed in, for example, N. A. Mahadik, et. al., can be used, and details thereof are not described herein.

To read data from the memory cell 10C, a method using electroluminescence (EL) or photoluminescence (PL) can be used.

In the method of reading data using electroluminescence, an electric field is applied to memory cells 10C from which data is read and electrons and/or holes are injected. When the injected electrons or holes are trapped in a stacking fault 15, first light is emitted and when they are trapped in a region other than the stacking fault 15, second light is emitted. The first light and the second light are observed through the aperture 19 to determine the development state of the stacking fault 15 in each memory cell 10C, that is, to determine the bit value stored in each memory cell 10C on the basis of the difference in wavelength of light.

In the method of reading data using photoluminescence, the semiconductor storage element 10 is irradiated with excitation light having a certain wavelength through the aperture 19. When the excitation light is absorbed in the stacking fault 15, de-excitation occurs and light is emitted. The light from the stacking fault 15 and the excitation light reflected from the surface of the SiC substrate 11 or the lower electrode 16 are observed through the aperture 19 to determine the development state of the stacking fault 15 in each memory cell 10C, that is, to determine the bit value stored in each memory cell 10C on the basis of the difference in wavelength of light.

According to the fourth embodiment described above, stacking faults 15 are developed or reduced upon application of optical stress to the memory cell array 101 including the semiconductor storage elements 10 arranged in a matrix and made of a compound semiconductor including stacking faults 15. The resistance value that varies in accordance with the state of the stacking fault 15 is associated with a bit value. In the same manner as described in the first to third embodiments, this configuration can implement an involatile semiconductor storage device 100 that can store therein information using the characteristics of the stacking fault 15. Using the characteristics of the expanding and contracting stacking fault 15 for storing information can achieve a rewritable, variable resistance semiconductor storage device 100.

The other configurations, operations, and effects of the fourth embodiment are the same as those of the first to third embodiments above, and details thereof are not described herein.

Fifth Embodiment

A fifth embodiment will be described with reference to the accompanying drawings. As described in the fourth embodiment, stacking faults formed in a compound semiconductor having a hexagonal crystal structure can be detected by application of light and the development and reduction of the stacking faults can be controlled by application of light. The fifth embodiment describes a recording medium made of a compound semiconductor having a hexagonal crystal structure to which or from which information can be optically read, written, or erased and describes an optical disc drive for the recording medium with reference to a preferred example.

Figure 15:
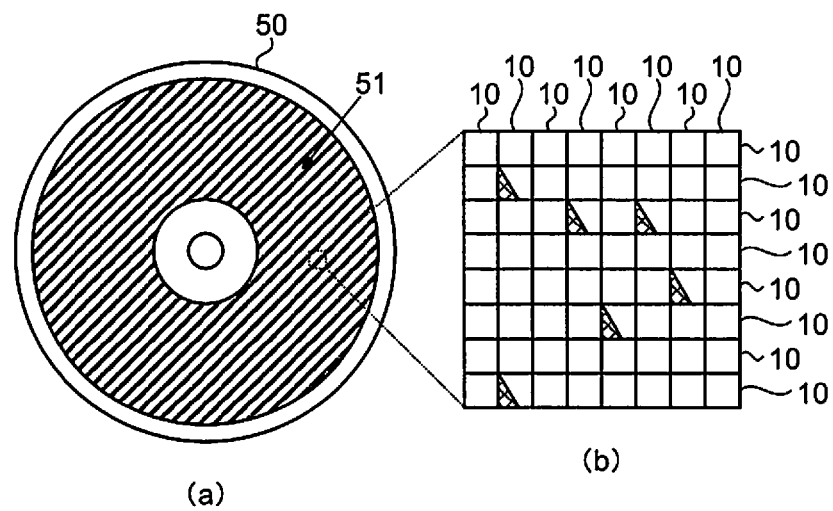
FIG. 15 is a diagram illustrating an example optical disc as a recording medium according to a fifth embodiment.

FIG. 15 is a diagram illustrating an example optical disc as a recording medium according to the fifth embodiment. FIG. 15($a$) is a diagram of an optical disc 50 seen from a recording surface 51 and FIG. 15($b$) is an enlarged partial view of FIG. 15($a$). As illustrated in FIG. 15, for example, a plurality of semiconductor storage elements 10 according to the first to fourth embodiments above are formed on the recording surface 51 of the optical disc 50. Adjacent semiconductor storage elements 10 may be separated by an insulation film and trenches, or may have a unitary structure.

Figure 16:
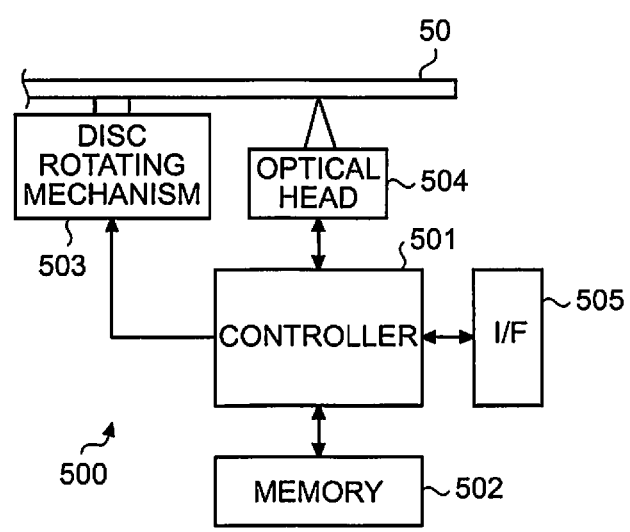
FIG. 16 is a block diagram illustrating an example optical disc drive according to the fifth embodiment.

FIG. 16 is a block diagram illustrating an example optical disc drive according to the fifth embodiment. As illustrated in FIG. 16, this optical disc drive 500 includes a controller 501, a memory 502, a disc rotating mechanism 503, an optical head 504, and an interface (I/F) 505.

The memory 502 is configured by, for example, a read only memory (ROM), and stores therein various types of information for operating the optical disc drive 500. Upon reception of a command from an external device via the I/F 505, the controller 501 controls the disc rotating mechanism 503 and the optical head 504 in accordance with the information stored in the memory 502.

The disc rotating mechanism 503 includes, for example, a shaft for supporting the optical disc 50 and a motor for rotating the shaft, and rotates the optical disc 50 at a certain rotation rate under the control of the controller 501.

The optical head 504 includes, for example, a laser diode, a pickup lens, and an optical sensor and reads, writes, or erases data to or from the optical disc 50 in accordance with the command from the controller 501.

As illustrated in FIGS. 15 and 16, for example, the semiconductor storage elements 10 may be coaxially arranged on the recording surface 51 if the optical disc 50 has a circular shape. The optical disc 50 is not limited to this, and may have a square shape, an oval shape, or various other shapes.

According to the fifth embodiment described above, an involatile and rewritable recording medium that records information using the expanding and contracting characteristics of the stacking fault 15 and a drive device for the recording medium can be implemented.

The other configurations, operations, and effects of the fifth embodiment are the same as those of the first to fourth embodiments above, and details thereof are not described herein.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising a plurality of memory cells arranged in a matrix, wherein
each of the plurality of memory cells includes:
a semiconductor storage element including a silicon carbide substrate and a silicon carbide film on a first surface of the silicon carbide substrate;
a lower electrode on a second surface facing away from the first surface of the silicon carbide substrate; and
an upper electrode on at least part of at least one third surface of the silicon carbide film, the third surface facing away from the first surface of the silicon carbide film in contact with the silicon carbide substrate, and
each memory cell includes at least one basal plane dislocation formed at at least part of the semiconductor storage element;
the upper electrode has an aperture through which light is input and output to and from the semiconductor storage element, and
when data is written to a first memory cell of the plurality of memory cells, light having a first wavelength is input to the semiconductor storage element through the aperture to develop a stacking fault from the basal plane dislocation in the first memory cell.

2. The semiconductor storage device according to claim 1, wherein the basal plane dislocation extends from a crack formed in the silicon carbide substrate or in the silicon carbide film.

3. The semiconductor storage device according to claim 1, further comprising:
a plurality of word lines each being connected to memory cells arranged in a row direction of the plurality of memory cells arranged in a matrix as one group;
a plurality of bit lines each being connected to memory cells arranged in a column direction of the plurality of memory cells arranged in a matrix as one group;
a drive unit configured to selectively drive the plurality of word lines;
a column module configured to selectively drive the plurality of bit lines; and
a controller configured to control the drive unit and the column module, wherein
when the controller writes data to a first memory cell of the plurality of memory cells, the controller controls the drive unit and the column module to apply a first current to the first memory cell to develop a stacking fault from the basal plane dislocation in the first memory cell.

4. The semiconductor storage device according to claim 3, wherein, when the controller erases the data stored in the first memory cell, the controller controls the drive unit and the column module to apply a second current different from the first current to the first memory cell to reduce the stacking fault in the first memory cell.

5. The semiconductor storage device according to claim 4, wherein, when the controller reads the data stored in the first memory cell, the controller controls the drive unit and the column module to apply a third current different from the first and second currents to the first memory cell and specifies the data from a resistance value of the first memory cell detected upon application of the third current.

6. The semiconductor storage device according to claim 1, further comprising:
a thermo sensor configured to detect a temperature of the plurality of memory cells, wherein when the thermo sensor detects a first temperature, the controller applies the first current to the first memory cell to develop the stacking fault.

7. The semiconductor storage device according to claim 6, wherein, when the thermo sensor detects a second temperature different from the first temperature, the controller applies the second current to the first memory cell to reduce the stacking fault.

8. The semiconductor storage device according to claim 1, wherein, when the data stored in the first memory cell is erased, light having a second wavelength different from the first wavelength is input to the semiconductor storage element through the aperture to reduce the stacking fault developed from the basal plane dislocation in the first memory cell.

9. The semiconductor storage device according to claim 1, wherein, when the data stored in the first memory cell is read, the data stored in the first memory cell is specified by using electroluminescence or photoluminescence.

10. A method of controlling a semiconductor storage device including a plurality of memory cells each including a semiconductor storage element including a silicon carbide substrate and a silicon carbide film on a first surface of the silicon carbide substrate, a lower electrode on a second surface facing away from the first surface of the silicon carbide substrate, and an upper electrode on at least part of at least one third surface of the silicon carbide film, the third surface facing away from the first surface of the silicon carbide film in contact with the silicon carbide substrate, each memory cell including at least one basal plane dislocation formed at at least part of the semiconductor storage element, the method comprising:
applying a first current to a first memory cell of the plurality of memory cells to develop a stacking fault from the basal plane dislocation in the first memory cell, when data is written to the first memory cell.

11. The method of controlling a semiconductor storage device according to claim 10, further comprising:
applying a second current different from the first current to the first memory cell to reduce the stacking fault in the first memory cell, when the data stored in the first memory cell is erased.

12. The method of controlling a semiconductor storage device according to claim 11, further comprising:
applying a third current different from the first and second currents to the first memory cell and specifying the data from a resistance value of the first memory cell detected upon application of the third current, when the data stored in the first memory cell is read.

13. A method of controlling a semiconductor storage device including a plurality of memory cells each including a semiconductor storage element including a silicon carbide substrate and a silicon carbide film on a first surface of the silicon carbide substrate, a lower electrode on a second surface facing away from the first surface of the silicon carbide substrate, and an upper electrode on at least part of at least one third surface of the silicon carbide film, the third surface facing away from the first surface of the silicon carbide film in contact with the silicon carbide substrate, each memory cell including at least one basal plane dislocation formed at at least part of the semiconductor storage element,
the upper electrode having an aperture through which light is input and output to and from the semiconductor storage element, the method comprising:
inputting light having a first wavelength to the semiconductor storage element through the aperture to develop a stacking fault from the basal plane dislocation in a first memory cell of the plurality of memory cells, when data is written to the first memory cell.

14. The method of controlling a semiconductor storage device according to claim 13, further comprising:

inputting light having a second wavelength different from the first wavelength to the semiconductor storage element through the aperture to reduce the stacking fault developed from the basal plane dislocation in the first memory cell, when the data stored in the first memory cell is erased.

15. The method of controlling a semiconductor storage device according to claim 13, further comprising:

specifying the data stored in the first memory cell by using electroluminescence or photoluminescence, when the data stored in the first memory cell is read.

16. A computer program product having a computer readable medium including programmed instructions, wherein the instructions, when executed by a computer, cause the computer to control a semiconductor storage device including a plurality of memory cells each including a semiconductor storage element including a silicon carbide substrate and a silicon carbide film on a first surface of the silicon carbide substrate, a lower electrode on a second surface facing away from the first surface of the silicon carbide substrate, and an upper electrode on at least part of at least one third surface of the silicon carbide film, the third surface facing away from the first surface of the silicon carbide film in contact with the silicon carbide substrate, each memory cell including at least one basal plane dislocation formed at at least part of the semiconductor storage element, the semiconductor storage device including
a plurality of word lines each being connected to memory cells arranged in a row direction of the plurality of memory cells arranged in a matrix as one group;
a plurality of bit lines each being connected to memory cells arranged in a column direction of the plurality of memory cells arranged in a matrix as one group;
a drive unit configured to selectively drive the plurality of word lines;
a column module configured to selectively drive the plurality of bit lines; and
a processor configured to control the drive unit and the column module, the computer program product causing the processor to control the drive unit and the column module to apply a first current to a first memory cell of the plurality of memory cells to develop a stacking fault from the basal plane dislocation in the first memory cell, when data is written to the first memory cell.

17. The computer program product according to claim 16 further causing the processor to apply a second current different from the first current to the first memory cell to reduce the stacking fault in the first memory cell, when the data stored in the first memory cell is erased.

18. The computer program product according to claim 17 further causing the processor to apply a third current different from the first and second currents to the first memory cell and specify the data from a resistance value of the first memory cell detected upon application of the third current, when the data stored in the first memory cell is read.

* * * * *